US006242277B1

(12) United States Patent
Lin et al.

(10) Patent No.: US 6,242,277 B1
(45) Date of Patent: Jun. 5, 2001

(54) METHOD OF FABRICATING A COMPLEMENTARY METAL-OXIDE SEMICONDUCTOR SENSOR DEVICE

(75) Inventors: Wei-Chang Lin, Hsinchu; Yuan-Chi Pai, Nantou, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/136,697

(22) Filed: Aug. 19, 1998

(30) Foreign Application Priority Data

Jun. 9, 1998 (TW) .................................. 87109135

(51) Int. Cl.[7] .................................. H01L 21/28
(52) U.S. Cl. .......................... 438/70; 438/69; 438/199
(58) Field of Search .................. 438/57, 60, 65, 438/66, 67, 69, 75, 70, 199

(56) References Cited

U.S. PATENT DOCUMENTS

| 5,266,501 | * | 11/1993 | Imai | 437/2 |
| 5,336,367 | * | 8/1994 | Nomura | 156/655 |
| 5,470,760 | * | 11/1995 | Nakai | 437/2 |
| 5,595,930 | * | 1/1997 | Baek | 437/53 |
| 5,672,519 | * | 9/1997 | Song | 437/3 |
| 5,677,200 | * | 10/1997 | Park | 437/3 |
| 6,157,017 | * | 12/2000 | Kim | 250/208.1 |

* cited by examiner

Primary Examiner—Mary Wilczewski
Assistant Examiner—Dave Goodwin
(74) Attorney, Agent, or Firm—Thomas, Kayden, Horstemeyer & Risley

(57) ABSTRACT

A planarized layer is formed on the substrate, and an opening is formed. A microlens resist layer is formed over the planarized layer, wherein the microlens resist layer has a bigger thickness in the opening than on the planarized layer. A first photoresist layer is formed on the microlens layer. The first photoresist layer has a pattern align to the color filter. A first exposure step is performed at least onto the microlens layer to form a first exposed portion, using the first photoresist layer as a mask, and the first photoresist layer is removed. A second photoresist layer is performed on the microlens resist layer. The second photoresist layer has a pattern align to the opening. A second exposure step is performed at least onto the microlens layer to form a second exposed portion, using the second photoresist layer as a mask, and the second photoresist layer is removed. A positive development step is performed to remove the first exposed portion and the second exposed portion of the microlens resist layer and to form a plurality of microlens blocks align to the color filter. An after-development-exposure step and a curing step are performed so that each of the microlens blocks forms a microlens. The microlens has a substantially rounded semi-circle structure.

21 Claims, 5 Drawing Sheets

METHOD OF FABRICATING A COMPLEMENTARY METAL-OXIDE SEMICONDUCTOR SENSOR DEVICE

CROSS-REFERENCE TO RELATED APPLICATION

This application claims the priority benefit of Taiwan application serial no. 7109135, filed Jun. 9, 1998, the full disclosure of which is incorporated herein by reference.

BACKGROUND OF THE INVENTION

1. Field of the Invention

This invention relates to a method of fabricating a complementary metal-oxide-semiconductor (CMOS) sensor device, and more particularly, to a method of fabricating microlens on a color filter.

2. Description of Related Art

Conventionally, for a PC camera and a digital camera, CMOS sensors are frequently used. A typical CMOS sensor diode includes a sensor layer on the substrate. The sensor layer has different sensor areas to detect different color light. On the sensor layer, there is a passivation and there is a color filer on the passivation. Furthermore, a color filter is formed on the passivation. The incident light usual has different color and incident angles. As the incident light penetrates through the color filter, it is divided into three color light, such as red light, green light or blue light and then absorbed and sensed by the corresponding sensor area.

FIG. 1A to FIG. 1F illustrates the process flow of fabricating a conventional CMOS sensor device. First, referring to FIG. 1A, on a substrate 100, a passivation layer 102 is formed. A color filter 108, including red filter 108a, green filter 108b and blue filter 108c, is formed on the passivation layer 102. The color filter 108 is made from acrylic material. Next, a planarized layer 103 is formed over the passivation layer 102 and the color filter 108. An opening 104 and an opening 106 are defined on the planarized layer 103 and the passivation layer 102. The opening 104 is for connecting the pad and the opening 106 is for connecting the scribe. Then, a microlens resist layer 110id formed over the opening 104, the opening 106 and the planarized layer 103. It is observable that the microlens resist layer 110 has different thickness at different points.

Especially, the photoresist in the opening 104 has a thickness Hi of about 4–5 μm.

Next, referring to FIG. 1B, a photoresist layer 112 is formed and patterned on the microlens resist layer 110. Then, referring to FIG. 1C, as the photoresist layer 112 as a mask, the microlens resist layer 110 is etched to expose the opening 104 and the opening 106. Then, referring to FIG. 1D, the photoresist layer 112 is removed to expose the patterned microlens resist block 110a. The microlens resist block 110a is aligned to the color filter 108. The microlens resist block 110a includes a number of protuberances 110a. The cross section of each protuberance 110a can be rectangle or polygon.

Next, referring to FIG. 1E and FIG. 1F, an after-development-exposure step is performed so that the microlens resist blocks 110a becomes a number of semi-circle microlens 110b. Then, after curing treatment onto the semi-circle microlens 110b, conventional microlens structure of a color filter of a CMOS sensor device is accomplished.

However, the conventional process for forming CMOS sensor device has lots of drawbacks. For example, the thickness of the microlens resist layer 110 in the pad opening 104 is more than at other point for about 4–5 μm. As a result, the exposure energy required for different points has a great variety. If an exposure energy suitable for exposing the region around the color filter 108 is used, scum effect will occur in the pad opening due to insufficient energy. On the other hand, if an exposure energy suitable for exposing the region around the pad opening 104 is used, after exposure and development, the defined microlens resist block 110a will have shrinking size, even, of 2–3 μm. That is because of over-exposure. Especially for pixel size of less than 10 μm, error of 2–3 μm produces a great influence.

SUMMARY OF THE INVENTION

It is therefore an objective of the present invention to provide a method of fabricating a CMOS sensor device, by regional exposure and using one more step of photoresist coating and exposure. Certain predetermined regions can be exposed with larger dosage and longer period. Some other regions can be exposed with less dosage. Consequently, the size of the defined microlens resist block 110a will not shrink and also scum will not occur.

It is another an objective of the present invention to provide a method of fabricating a complementary metal-oxide-semiconductor (CMOS) sensor device. A planarized layer is formed on the substrate, and an opening is formed. A microlens resist layer is formed over the planarized layer, wherein the microlens resist layer has a bigger thickness in the opening than on the planarized layer. A first photoresist layer is formed on the microlens layer. The first photoresist layer has a pattern align to the color filter. A first exposure step is performed at least onto the microlens layer to form a first exposed portion, using the first photoresist layer as a mask, and the first photoresist layer is removed. A second photoresist layer is performed on the microlens resist layer. The second photoresist layer has a pattern align to the opening. A second exposure step is performed at least onto the microlens layer to form a second exposed portion, using the second photoresist layer as a mask, and the second photoresist layer is removed. A positive development step is performed to remove the first exposed portion and the second exposed portion of the microlens resist layer and to form a plurality of microlens blocks align to the color filter. An after-development-exposure step and a curing step are performed so that each of the microlens blocks forms a microlens. The microlens has a substantially rounded semi-circle structure.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

This invention is characterized by utilizing a step of photoresist coating and exposure after or before microlens exposure. For example, adding a mask for bonding pad opening to adjust the exposure amount at different regions.

As a result, precise exposure amount can be obtained and the problems of scum in the pad opening and small microlens can be overcome.

Figure 1A:
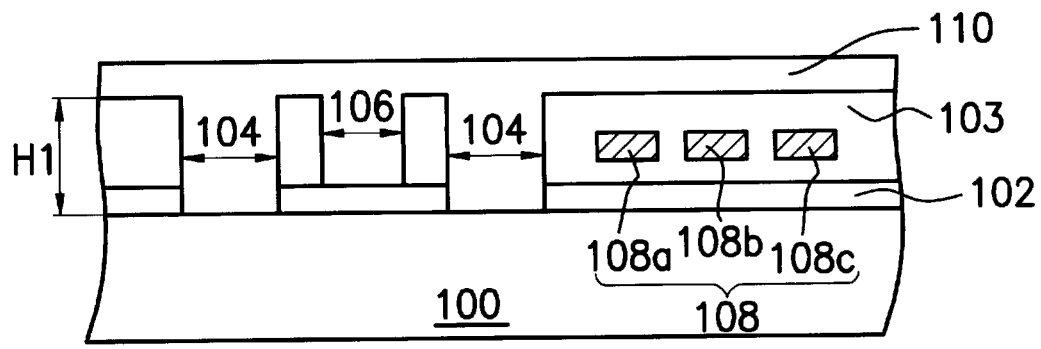
FIG. 1A through FIG. 1F are cross-sectional views showing a process flow of fabricating a conventional CMOS sensor device; and FIG. 2A through FIG. 2H is cross-sectional views showing a process flow of fabricating a CMOS sensor device according to a preferred embodiment of the invention.
Figure 1B:
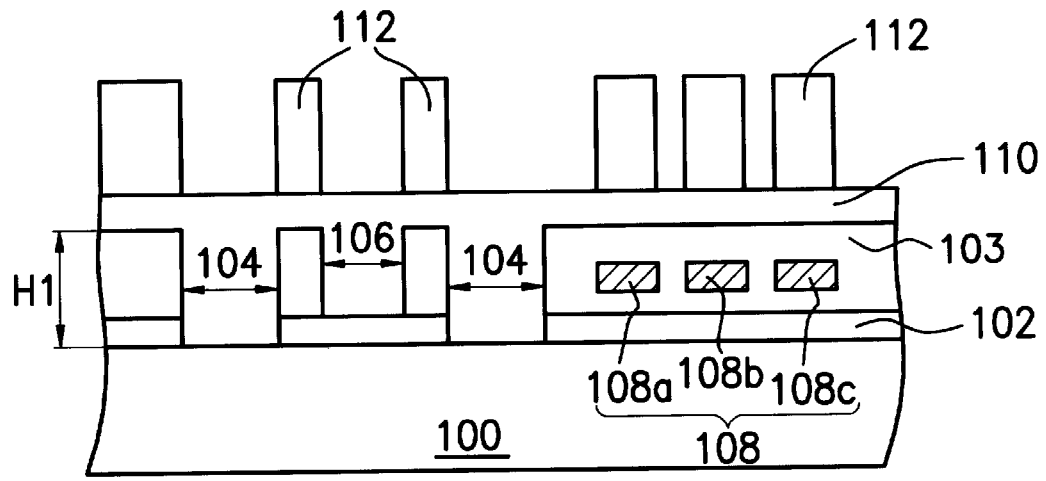
Figure 1C:
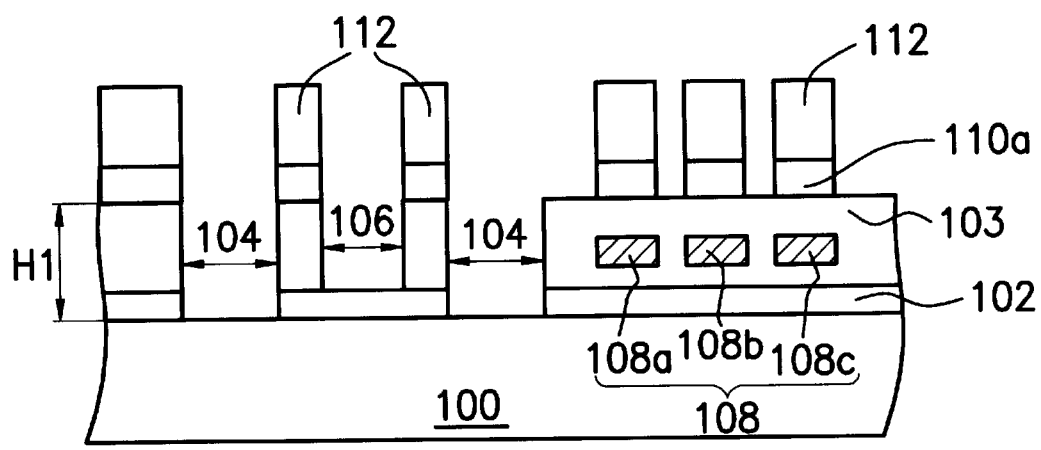
Figure 1D:
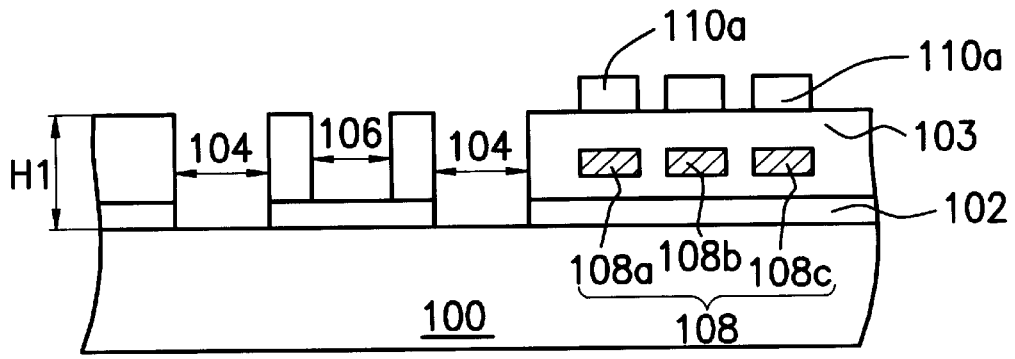
Figure 1E:
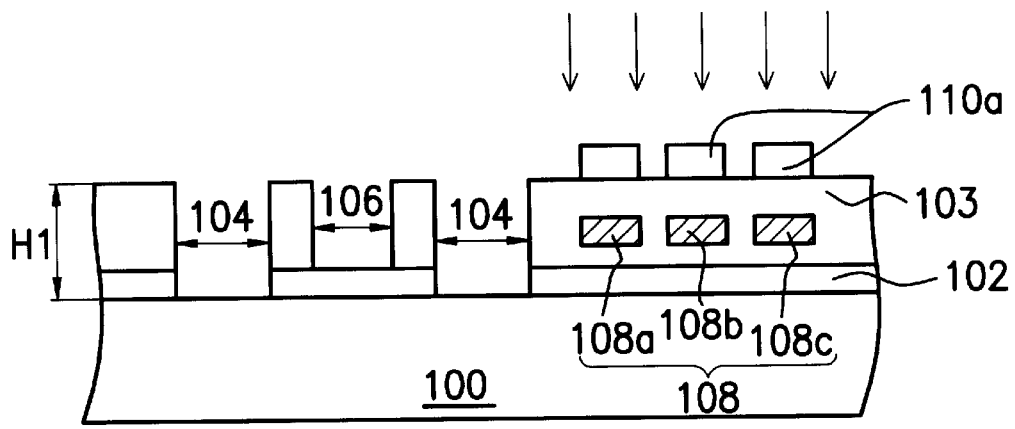
Figure 1F:
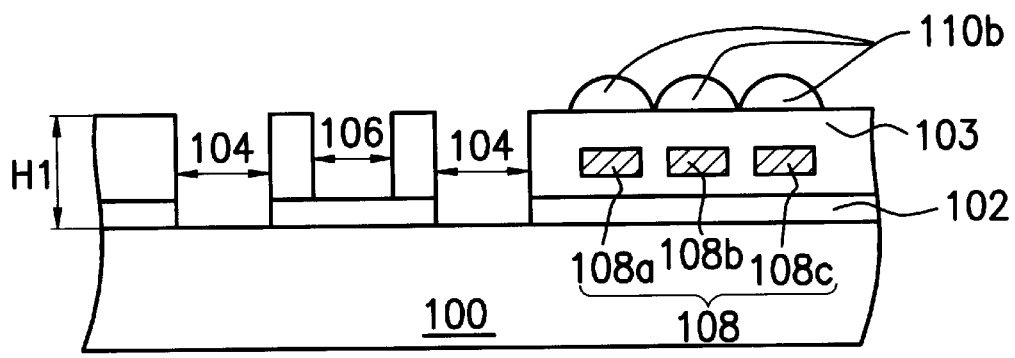
Figure 2A:
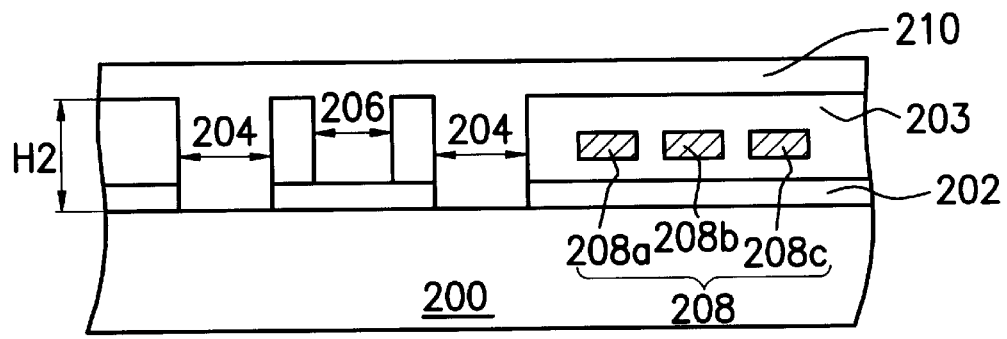

First, referring to FIG. 2A, on a substrate 200, a sensor region (not shown) is designed. The sensor region is for absorbing and as a sensor to detect different color light. A passivation layer 202 is formed on the substrate 200. The material of the passivation layer 202 can be, for example, silicon oxide or silicon nitride. Then, A color filter 208, including red filter 208a, green filter 208b and blue filter 208c, is formed on the passivation layer 202. The color filter 208 is preferably made from acrylic material and preferrably made by electrolysis, dye method or pigment dispersion. Next, a planarized layer 203 is formed over the passivation layer 202 and the color filter 208. The preferred material of the planarized layer 203 includes acrylic. An opening 204 and an opening 206 are defined on the planarized layer 203 and the passivation layer 202. The opening 204 is for connecting the pad and the opening 206 is for connecting the scribe. Then, a microlens resist layer 210 is formed over the opening 204, the opening 206 and the planarized layer 203. It is observable that the microlens resist layer 210 has different thickness at different points. Especially, the photoresist in the opening 204 has a thickness H1 of about 4–5 μm.

Figure 2B:
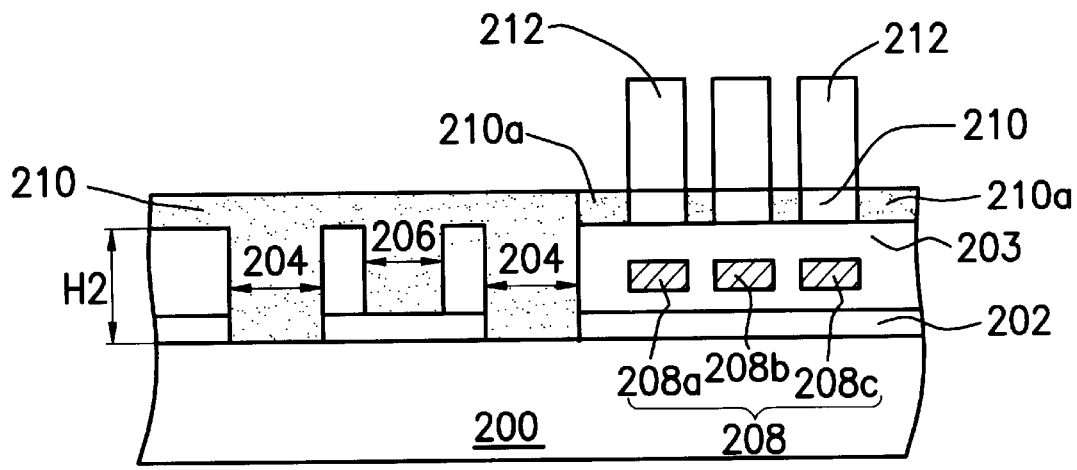

Next, referring to FIG. 2B, a first photoresist layer 212 is formed and patterned. The first photoresist layer 212 is patterned to leave only a certain portion align to the color filter 208 but expose the microlens resist layer 210 above the opening 204 and the opening 206. The material of the first photoresist layer 212 can be, for example, positive photoresist. Then, a first exposure step is performed onto the microlens resist layer 210, using the first photoresist layer 212 as a mask, to form an exposed first region 210a.

Figure 2C:
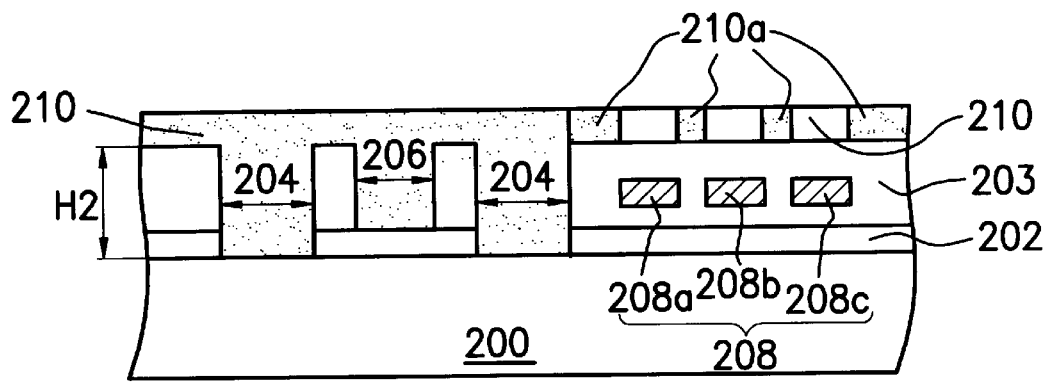

Next, referring to FIG. 2C, the first photoresist layer 212 is removed to expose the exposed first region 210a.

Figure 2D:
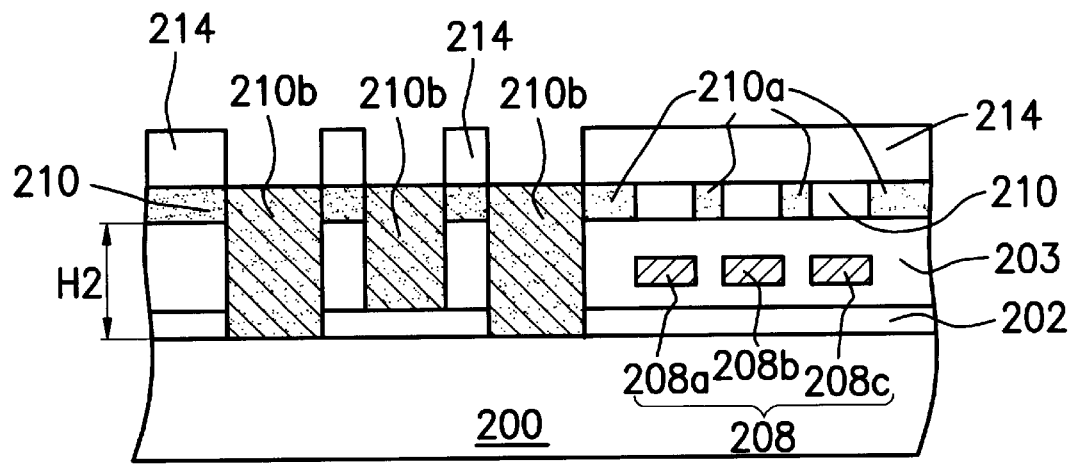

Then, referring to FIG. 2D, a second photoresist layer 214 is formed and patterned on the microlens resist layer 210. The second photoresist layer 214 is patterned to expose a portion of the microlens resist layer 210 align to the opening 204 and the opening 206. The material of the second photoresist layer 214 can be, for example, positive photoresist. Then, a second exposure step can be performed onto the microlens resist layer 210, using the second photoresist layer 214 as a mask, to form an exposed second region 210b. Since the second exposed second region 210b is thicker than the first exposed second region 210a; the exposure amount for the second exposure step is larger than the exposure amount of the first exposure step.

Figure 2E:
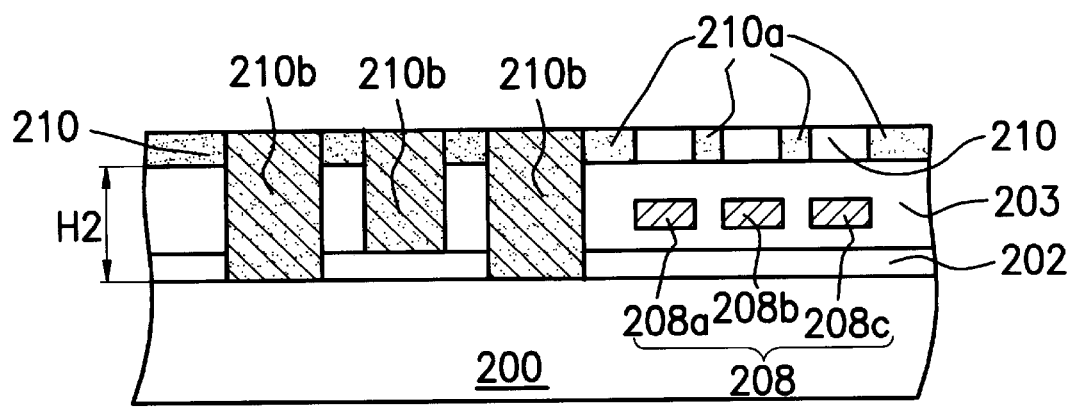

Next, referring to FIG. 2E, the second photoresist layer 214 is removed to expose the microlens resist layer 210, the exposed first region 210a and the exposed second region 210b.

Figure 2F:
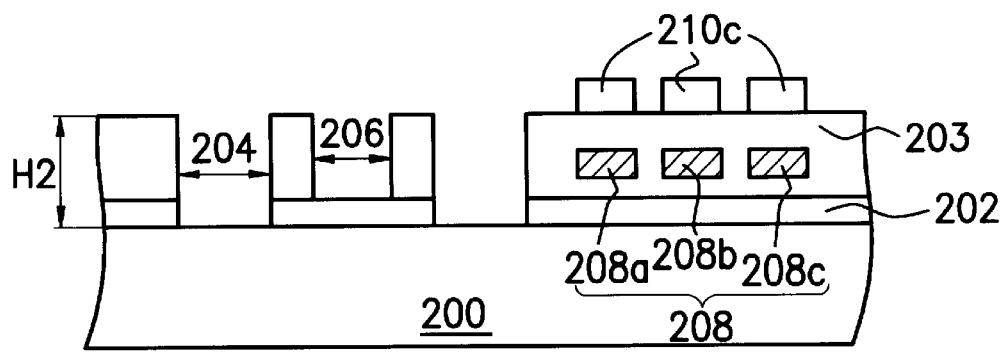

Then, referring to FIG. 2F, a positive development process is performed to remove the exposed first region 210a and the exposed second region 210b and to form a number of microlens blocks 210c align to the color filter 208. The cross section of each of the microlens blocks 210c can be rectangle or polygon.

Figure 2G:
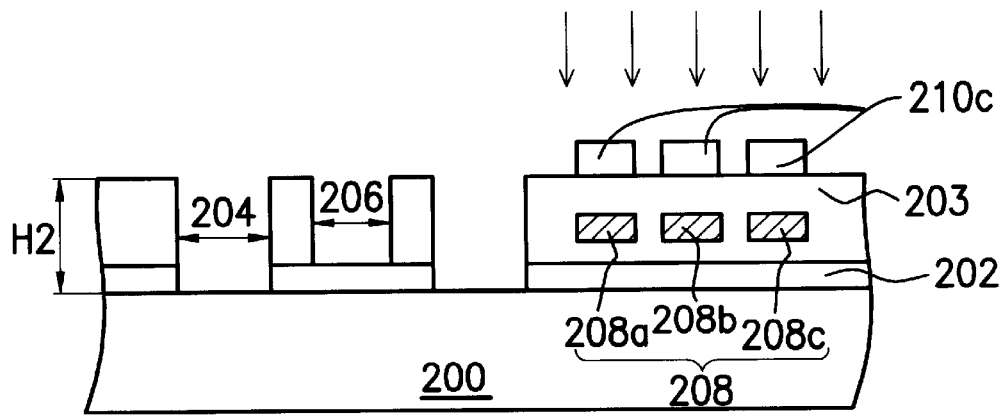

Next, referring to FIG. 2G, an after-development-exposure step is performed so that each of the microlens blocks 210c becomes a microlens structure 210d. The cross section of each of the microlens blocks 210d can be a rounded semi-circle.

Figure 2H:
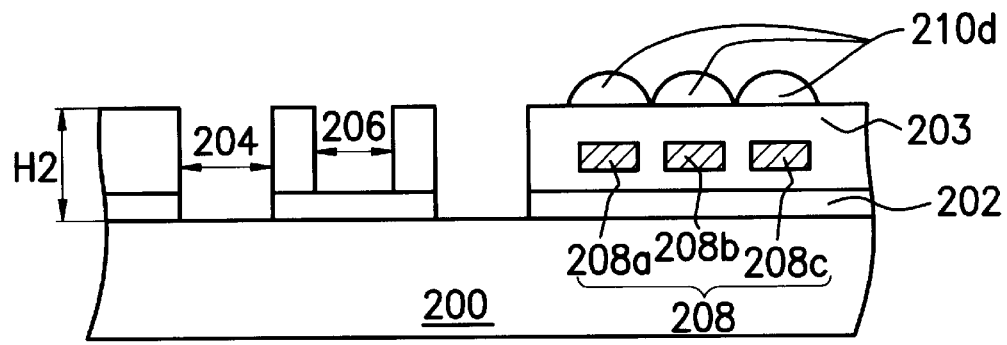

Next, referring to FIG. 2H, a curing step is performed so that the structure of each of the microlens 210d is firmer and can last longer.

To sum up, the method of fabricating a CMOS sensor device according to the invention has the following advantages:

(1) Different exposure amount can be supplied to different regions of the microlens resist layer 210 with different thickness, by using an extra step of photoresist coating and exposure. Consequently, the structure of the microlens 210d can have precise size.

(2) Scum in the pad opening due to insufficient exposure and small microlens 210d due to excess exposure can be overcome.

(3) The method of the invention is suitable for all processes for fabricating microlens of color filter of CMOS sensor devices.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a complementary metal-oxide-semiconductor (CMOS) sensor device, wherein on a substrate, a passivation layer, a color filter and a planarized layer are successively formed on the substrate, and an opening is formed through the planarized layer and the passivation layer, the opening exposing the a portion of the substrate, wherein the method comprises:

forming a microlens resist layer over the opening and the planarized layer, wherein the microlens resist layer has a bigger thickness in the opening than on the planarized layer;

forming a first photoresist layer on the microlens layer, wherein the first photoresist layer has a pattern align to the color filter;

performing a first exposure step at least onto the microlens layer to form a first exposed portion, using the first photoresist layer as a mask, and removing the first photoresist layer;

forming a second photoresist layer on the microlens resist layer, wherein the second photoresist layer has a pattern align to the opening;

performing a second exposure step at least onto the microlens layer to form a second exposed portion, using the second photoresist layer as a mask, and removing the second photoresist layer;

performing a positive development step to remove the first exposed portion and the second exposed portion of the microlens resist layer and to form a plurality of microlens blocks align to the color filter; and performing an after-development-exposure step and a curing step so that each of the microlens blocks forms a microlens, wherein the microlens has a substantially rounded semi-circle structure.

2. The method of claim 1, wherein the passivation layer comprises silicon oxide.

3. The method of claim 1, wherein the passivation layer comprises silicon nitride.

4. The method of claim 1, wherein a material of the color filter comprises acrylic.

5. The method of claim 1, wherein a material of the planarized layer comprises acrylic.

6. The method of claim 1, wherein the first photoresist layer is positive photoresist.

7. The method of claim 1, wherein the second photoresist layer is positive photoresist.

8. The method of claim 1, wherein an exposure amount of the second exposure step is larger than an exposure amount of the first exposure step.

9. The method of claim 1, wherein each of the microlens blocks has a polygon cross-section.

10. A method of fabricating a CMOS sensor device, wherein there is a planarized layer on a substrate, and the planarized layer includes a first structure and a second structure, the first structure exposing a portion of the substrate, wherein the method comprises:

forming a transparent resist layer on the planarized layer, wherein a thickness of the transparent resist layer at the first structure is different from a thickness of the transparent resist layer at the second structure;

forming a first photoresist layer on the transparent resist layer wherein the first photoresist layer has a pattern align to the second structure;

performing a first exposure step at least onto the transparent resist layer to form a first exposed portion, using the first photoresist layer as a mask, and removing the first photoresist layer;

forming a second photoresist layer on the transparent resist layer, wherein the second photoresist layer has a pattern align to the first structure;

performing a second exposure step at least onto the transparent resist layer to form a second exposed portion, using the second resist layer as a mask, and removing the second photoresist layer;

performing a positive development step to remove the first exposed portion and the second exposed portion of the microlens resist layer and to form a plurality of transparent resist blocks align to the second structure; and performing an after-development-exposure step and a curing step so that each of the transparent resist blocks forms a substantially rounded semi-circle structure.

11. The method of claim 1, wherein the first structure is a pad opening.

12. The method of claim 11, wherein the second structure is a color filter.

13. The method of claim 12, wherein a material of the second structure comprises acrylic.

14. The method of claim 10, wherein there is a passivation layer formed between the planarized layer and the substrate.

15. The method of claim 10, wherein the passivation layer comprises silicon nitride.

16. The method of claim 10, wherein the passivation layer comprises silicon oxide.

17. The method of claim 10, wherein the planarized layer comprises acrylic.

18. The method of claim 10, wherein the first photoresist layer comprises positive resist.

19. The method of claim 10, wherein the second photoresist layer comprises positive resist.

20. The method of claim 10, wherein an exposure amount of the first exposure step is different from an exposure amount of the second exposure step.

21. The method of claim 10, wherein each of the transparent resist blocks has a polygon cross-section.

* * * * *